(12) United States Patent
Funakubo et al.

(10) Patent No.: US 7,205,703 B2
(45) Date of Patent: Apr. 17, 2007

(54) ULTRASONIC VIBRATOR AND ULTRASONIC MOTOR USING THE ULTRASONIC VIBRATOR

(75) Inventors: Tomoki Funakubo, Tama (JP); Heiji Ogino, Hachioji (JP)

(73) Assignee: Olympus Corporation, Tokyo (JP)

( * ) Notice: Subject to any disclaimer, the term of this patent is extended or adjusted under 35 U.S.C. 154(b) by 130 days.

(21) Appl. No.: 10/941,732

(22) Filed: Sep. 15, 2004

(65) Prior Publication Data
US 2005/0062367 A1    Mar. 24, 2005

(30) Foreign Application Priority Data
Sep. 18, 2003   (JP)   ............... 2003-326839

(51) Int. Cl.
*H01L 41/08* (2006.01)
(52) U.S. Cl. ................................. 310/323.02
(58) Field of Classification Search ........... 310/323, 310/2, 323.12, 323.16, 328
See application file for complete search history.

(56) References Cited

U.S. PATENT DOCUMENTS 5,200,665 A * 4/1993 Iijima .................. 310/323.16
6,218,769 B1 * 4/2001 Iino et al. .................. 310/328
6,909,222 B2 * 6/2005 Sawada ...................... 310/328

FOREIGN PATENT DOCUMENTS

JP          3311446          5/2002

OTHER PUBLICATIONS

Patent Abstracts of Japan of Japanese Publication No. 07-163162, published Jun. 23, 1995.

* cited by examiner

*Primary Examiner*—Mark Budd
(74) *Attorney, Agent, or Firm*—Scully, Scott, Murphy & Presser, P.C.

(57) ABSTRACT

In an ultrasonic vibrator in which ultrasonic elliptical vibration is caused at a friction-projection by the simultaneous generation of a first vibration mode and a second vibration mode in a piezoelectric element, the friction-projection is formed by burning so as to be integrated with the piezoelectric element.

1 Claim, 11 Drawing Sheets

ULTRASONIC VIBRATOR AND ULTRASONIC MOTOR USING THE ULTRASONIC VIBRATOR

CROSS-REFERENCE TO RELATED APPLICATION

This application claims benefits of Japanese Application No. 2003-326839 filed in Japan on Sep. 18, 2003, the contents of which are incorporated by this reference.

BACKGROUND OF THE INVENTION

1. Field of the Invention

The present invention relates to an ultrasonic vibrator and an ultrasonic motor using the ultrasonic vibrator.

2. Description of the Related Art

Conventionally, different types of ultrasonic motors have been known. For example, Japanese Patent No. 3311446 discloses an example of the ultrasonic motors.

Hereinafter, the ultrasonic motor disclosed in Japanese Patent No. 3311446 will be described as a typical one.

Ordinarily, ultrasonic motors are provided with ultrasonic vibrators. The ultrasonic vibrator is formed as described below.

First, for the ultrasonic vibrator, a plurality of first piezoelectric sheets which are thin and have a rectangular shape and a plurality of second piezoelectric sheets which are thin and have a rectangular shape are laminated to each other. A pair of internal electrodes are printed on each first piezoelectric sheet. A pair of internal electrodes are printed on each second piezoelectric sheet. The ultrasonic vibrator has a structure in which these first and second piezoelectric sheets are alternately laminated.

The internal electrodes are formed so as to extend to the side faces and the upper surface of the ultrasonic vibrator. Regarding these piezoelectric sheets, the internal electrodes are printed on green sheets made of lead titanate zirconate (hereinafter, abbreviated to PZT). Then, the green sheets are positioned, laminated, and fired. Thus, these piezoelectric sheets are formed into a piezoelectric laminate unit.

External electrodes are provided in the positions of the piezoelectric laminate unit where the internal electrodes of the ultrasonic vibrator are exposed (two sites as positive poles on the upper surface of the ultrasonic vibrator and two sites as negative poles on the side faces of the ultrasonic vibrator).

Further, in the piezoelectric laminate unit, the external electrode provided on the upper surface on the left side and the external electrode provided on the left side-face are connected to each other via a lead wire. Thus, an electrical terminal is formed. An alternating voltage, which is described below, is applied to this electrical terminal for phase A.

Moreover, in the piezoelectric laminate unit, the external electrode provided on the upper surface on the right side and the external electrode provided on the right side-face are connected to each other via a lead wire. Thus, an electrical terminal is formed. An alternating voltage, which is described below, is applied to this electrical terminal for phase B.

The polarization can be performed by application of predetermined DC voltages to the respective electrical terminals for the phases A and B.

Furthermore, in the piezoelectric laminate unit, a driving piece (friction projection) is bonded to the position at which the amplitude of the bending-vibration of the lower surface of the ultrasonic vibrator has substantially a maximum.

In the ultrasonic vibrator having the above-described structure, alternating voltages with a phase difference of $\pi/2$ are applied to the electrical terminals for the phases A and B, respectively. This excites the primary longitudinal vibration and the secondary bending vibration. Thus, a large elliptical vibration in a clockwise or counterclockwise direction is generated.

The ultrasonic motor using the ultrasonic vibrator further contains the following elements.

A through-hole is provided in the center of the ultrasonic vibrator. A pin for taking out a driving force is inserted and bonded in the trough-hole. Further, a pressing means which is engaged with the pin to press the driving piece in a predetermined direction, and a driven piece which is in contact with the driving piece of ultrasonic vibrator and is moved relatively to the driving piece. Thus, the ultrasonic motor is formed.

The driven piece is held on a linear guide. Thus, the driven piece can be slidingly moved while it is in contact with the driving piece and is guided by the linear guide.

In the ultrasonic motor formed as described above, alternating voltages with a phase difference of $\pi/2$ are applied to the electrical terminals in the phases A and B. Thereby, the primary longitudinal vibration and the secondary bending vibration are excited. As a result, a large elliptical movement is caused in the clockwise or counterclockwise direction. Thus, the driven piece is moved in the right and left direction.

SUMMARY OF THE INVENTION

Briefly, in the ultrasonic vibrator of the present invention in which a first vibration mode and a second vibration mode are simultaneously caused in a piezoelectric element, and thus, an ultrasonic elliptical vibration is generated at a friction projection, characteristically, the friction projection and the piezoelectric element are formed so as to be integrated with each other by burning.

Additional features and advantages of the invention will be set forth in the description which follows, and in part will be obvious from the description, or may be learned by practice of the invention. The features and advantages of the invention may be realized and obtained by means of the instrumentalities and combinations particularly pointed out hereinafter.

DESCRIPTION OF THE PREFERRED EMBODIMENTS

Hereinafter, the embodiments of the present invention will be described with reference to the drawings.

Figure 1A:
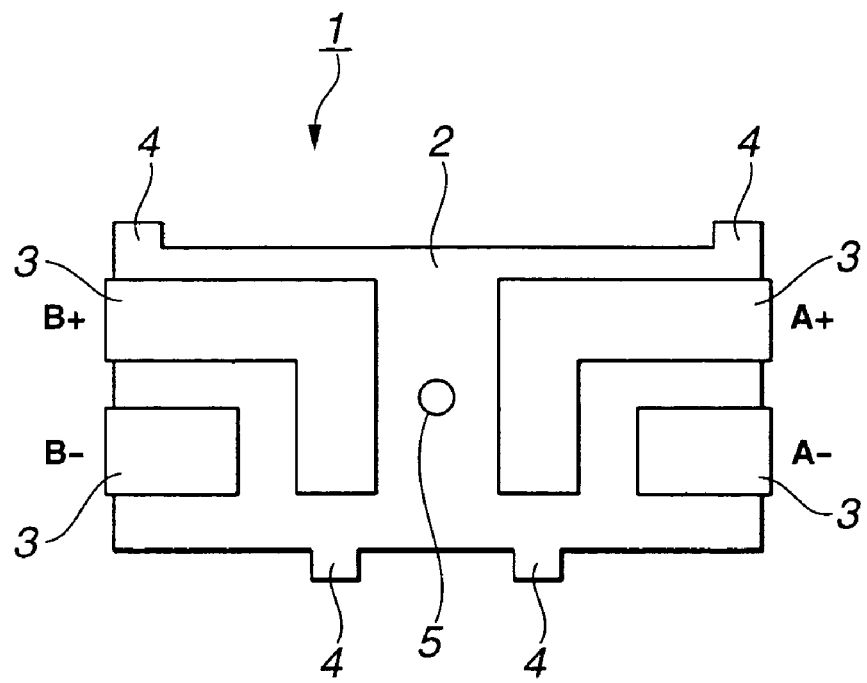
FIG. 1A is a front view of an ultrasonic vibrator according to a first embodiment of the present invention.

FIG. 1A is a front view of an ultrasonic vibrator according to a first embodiment of the present invention.

Figure 1B:
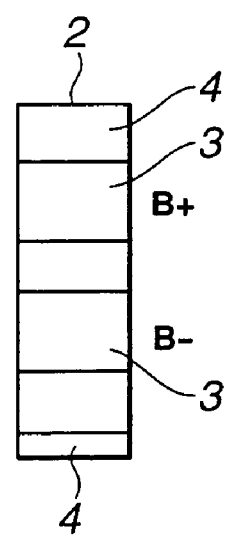
FIG. 1B is a side view showing one side of the ultrasonic vibrator according to the first embodiment.

FIG. 1B is a side view showing one side of the ultrasonic vibrator according to the first embodiment.

As shown in FIGS. 1A and 1B, the ultrasonic vibrator 1 comprises a piezoelectric laminate unit 2 made of a piezoelectric element and having substantially a prism shape, external electrodes 3 having a belt or crank shape which are provided at four sites on the right and left side faces and at four sites on the front surface, friction-projections formed so as to be integrated with the piezoelectric laminate unit 2 and positioned at two sites on the bottom of the piezoelectric laminate unit 2 and two sites on the upper surface thereof, and a hole 5 formed substantially in the center of the piezoelectric laminate unit 2.

The piezoelectric laminate unit 2 has a structure in which a plurality of first and second ceramic sheets 6 and 7 are alternately laminated. The ceramic sheets 6 and 7 are thin, rectangular piezoelectric sheets which are processed for internal electrodes. The detailed configuration will be descried below.

The external electrode 3 on the right side face as viewed in FIG. 1A comprises two electrical terminals (both terminals A+ and A−). The terminals, named terminals A (phase A), are attached to the portions of internal electrodes 8a and 9a (see FIG. 2) which are exposed at two sites on the right side face as viewed in FIG. 1A of the piezoelectric laminate unit 2.

Moreover, the external electrode 3 on the left side face as viewed in FIG. 1A comprises two electrical terminals (both terminals B+ and B−). The terminals, named terminals B (phase B), are attached to the portions of the internal electrodes 8a and 9a (see FIG. 2) which are exposed at two sites on the left side face as viewed in FIG. 1A of the piezoelectric laminate unit 2.

Hereinafter, the piezoelectric laminate unit 2 will be described in detail with reference to FIG. 2.

Figure 2:
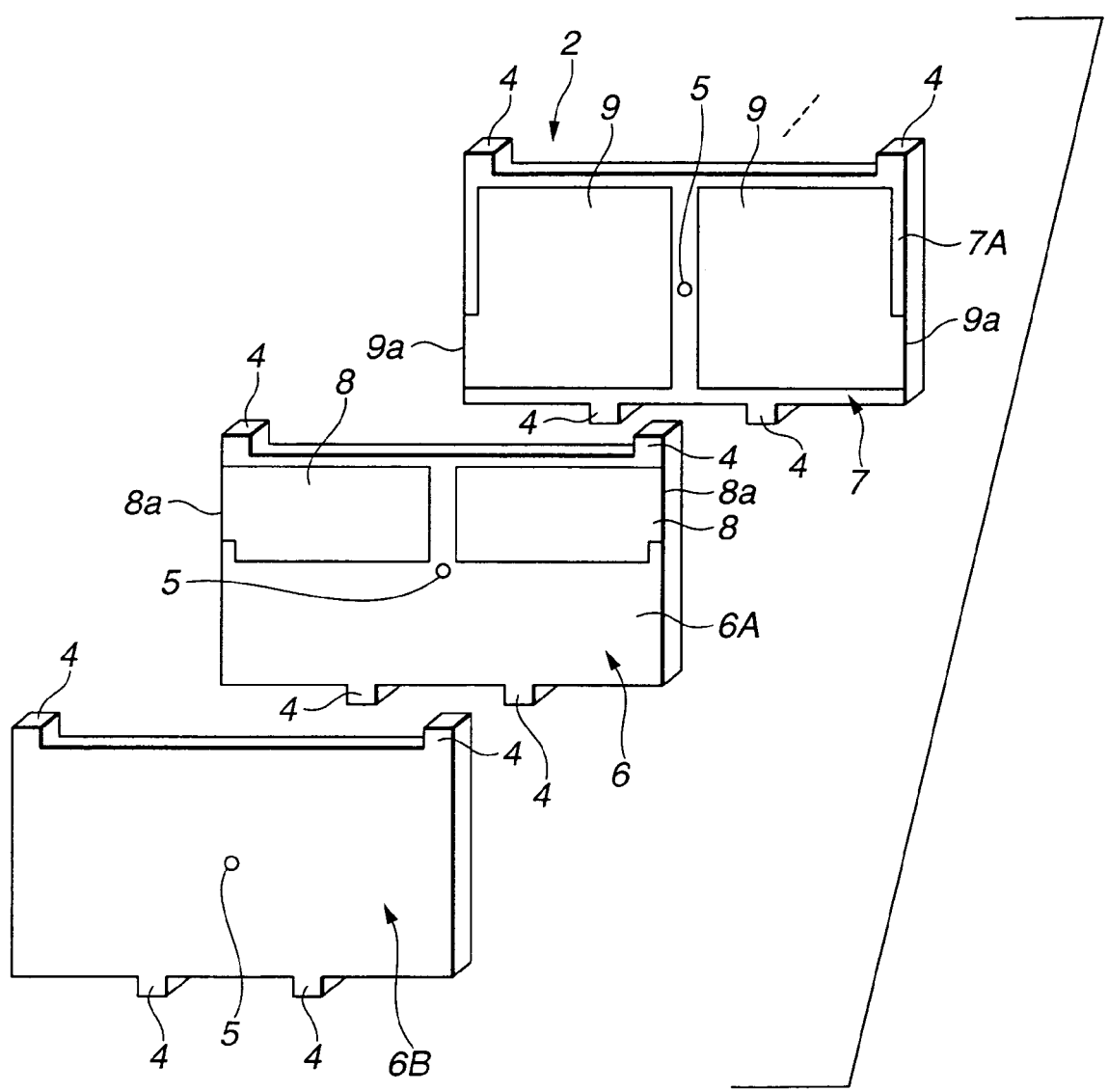
FIG. 2 is an exploded perspective view of an essential part of the piezoelectric laminate unit of the ultrasonic vibrator according to the first embodiment.

As shown in FIG. 2, the piezoelectric laminate unit 2 is composed of a plurality of first piezoelectric sheets 6 each having a first internal electrode 8 and a plurality of second piezoelectric sheets 7 each having a second internal electrode 9 which are alternately laminated.

The first piezoelectric sheet 6 contains a piezoelectric layer 6A which is a piezoelectric element having a thickness of, e.g., 50 μm. The friction-projections 4 are formed at two sites on the bottom face of the piezoelectric layer 6A and at two sites on the upper face thereof so as to be integrated with the piezoelectric layer 6A. The first internal electrode 8 is printed on the front surface of the first piezoelectric sheet 6.

The second piezoelectric sheet 7 contains a piezoelectric layer 7A which is a piezoelectric element having a thickness of, e.g., 50 μm. The friction-projections 4 are formed at two sites on the bottom face of the piezoelectric layer 7A and at two sites on the upper face thereof so as to be integrated with the piezoelectric layer 7A (these sites are the same as those of the first piezoelectric sheet 6). The second internal electrode 9 is printed on the front surface of the second piezoelectric sheet 7, which will be described later.

Referring to materials for the first piezoelectric sheet 6 and the second piezoelectric sheet 7, the sheets 6 and 7 are formed with PZT (lead titanate zirconate) in this embodiment.

In the piezoelectric laminate unit 2, a piezoelectric sheet 6B formed with the PZT and not having the internal electrode formed thereon is laminated as the first sheet of the laminate which is composed of a plurality of the first piezoelectric sheets 6 and a plurality of the second piezoelectric sheets 7 are laminated (the uppermost layer, i.e., the layer provided in front of the first piezoelectric sheet 6 as shown in FIG. 2).

The first internal electrode 8 and the second internal electrode 9 are formed with a silver-palladium alloy (Ag—Pd) or silver (Ag) as an electrode material.

In the ultrasonic vibrator 1 of this embodiment, as a result of the lamination of the first piezoelectric sheets 6 and the second piezoelectric sheets 7, the first internal electrodes 8 and the second internal electrodes 9 are alternately laminated.

That is, referring to the order by which the respective members constituting the piezoelectric laminate unit 2 are laminated in the ultrasonic vibrator of the first embodiment, the piezoelectric sheet 6B, the first internal electrode 8, the piezoelectric layer 6A, the second internal electrode 9, the piezoelectric layer 7A, . . . , the piezoelectric layer 7A, the first internal electrode 8, the piezoelectric layer 6A, the second internal electrode 9, and the piezoelectric layer 7A are laminated in that order.

Next, the shape and size of the first and second piezoelectric sheets 6 and 7 will be described below.

The first internal electrode 8 of the first piezoelectric sheet 6 is formed almost on the whole area on one side of the piezoelectric layer 6A in the cross-section of the piezoelectric laminate unit 2 and so as to be divided in right and left portions, as shown in detail in FIG. 2. A part of the first internal electrode 8 is extended to both of the edges of the side faces of the piezoelectric layer 6A so as to form internal electrode exposed portions 8a, respectively. According to the first embodiment, the interval between the right and left portions of the first internal electrode 8 is set at e.g., about 0.2 mm.

The second internal electrode 9 of the second piezoelectric sheet is formed almost on the whole area on one side of the piezoelectric layer 7A in the cross-section of the piezoelectric laminate unit 2 and so as to be divided in right and left portions, as shown in detail in FIG. 2. A part of the first internal electrode 8 is extended to both of the edges of the side faces of the piezoelectric layer 7A so as to form internal electrode exposed portions 9a, respectively. According to the first embodiment, the interval between the right and left portions of the second internal electrode 9 is set at, e.g., about 0.2 mm.

A hole 5 with a diameter of, e.g., 0.3 mm is formed substantially in the centers of the first piezoelectric sheet 6 and the second piezoelectric sheet 7 so as to pass through the sheets 6 and 7.

According to the first embodiment, the piezoelectric laminate unit 2 has a size of 5 mm in width, 1.26 mm in height, and 2 mm in depth.

As shown in FIGS. 1A and 1B, the ultrasonic vibrator 1 containing the piezoelectric laminate unit 2 formed as described above are provided with the external electrodes 3. The external electrodes 3 are formed by extending a part of the first internal electrode 8 of the piezoelectric laminate unit 2 and a part of the second internal electrode 9 thereof to both of the edges of the side faces of the ultrasonic vibrator 1, so that the internal electrode exposed portions 8a and 9a are formed, and baking silver on the exposed portions 8a and 9a.

That is, as shown in FIG. 1B, the external electrodes 3 on the side faces of the piezoelectric laminate unit 2 are connected to the internal electrodes 8a and 9a (see FIG. 2) and, thus, have a belt shape. Moreover, the external electrodes 3 are electrically connected to the other external electrodes 3 formed in a belt-pattern and in a crank-pattern via the edges of the piezoelectric laminate unit 2. The external electrodes on the side face opposite to the above-described side face of the piezoelectric laminate unit 2 are provided in the same patterns as the above-described external electrodes 3.

To these external electrodes 3, lead wires are connected by means of solder or the like, or a flexible substrate having electrodes is electrically connected. A driving signal is supplied from a driving circuit (not shown) via the lead wires or the flexible substrate.

In the ultrasonic vibrator 1 of the first embodiment, the friction-projections 4 are formed integrally with the piezoelectric laminate unit 2 in the positions on the bottom surface and the upper surface of the piezoelectric laminate unit 2, the positions substantially corresponding to the loops of a bending resonance vibration. That is, the friction-projections 4 are formed with the same material as the piezoelectric laminate unit 2.

Moreover, the through-hole 5 having a diameter of e.g., 0.3 mm is provided substantially in the center of the ultrasonic vibrator 1. It is not necessary that the hole 5 is a through-hole. The hole 5 may be formed so as to have a predetermined size in the piezoelectric laminate unit 2.

Figure 3A:
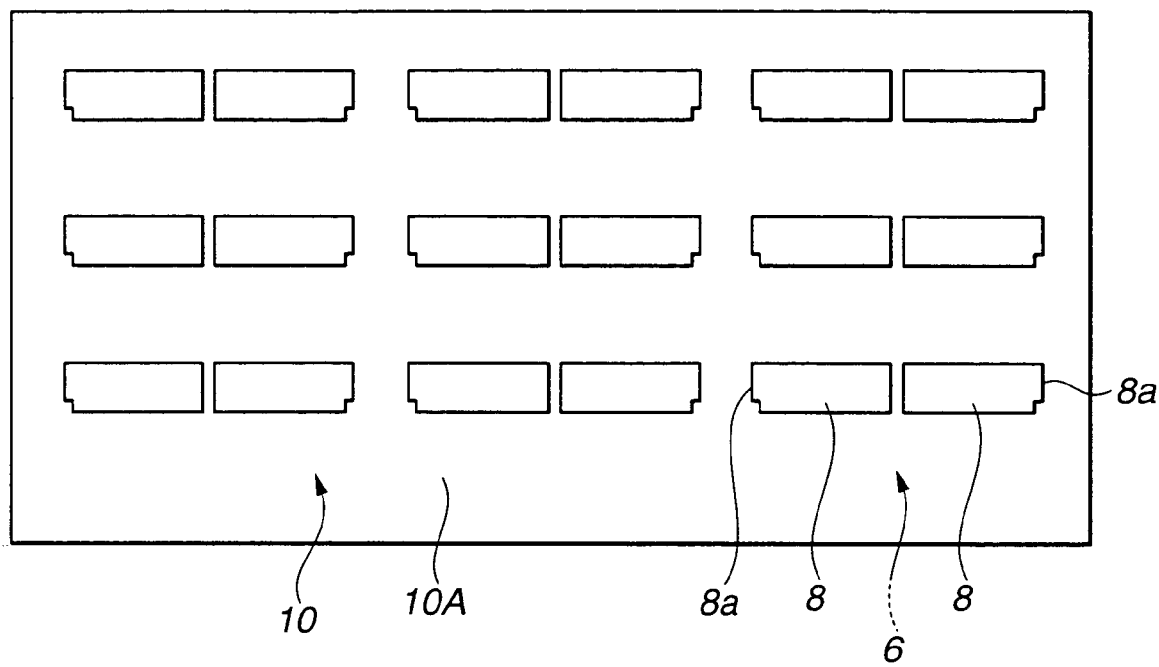
FIG. 3A is a front view of a first piezoelectric sheet contained in the ultrasonic vibrator according to the first embodiment.
Figure 3B:
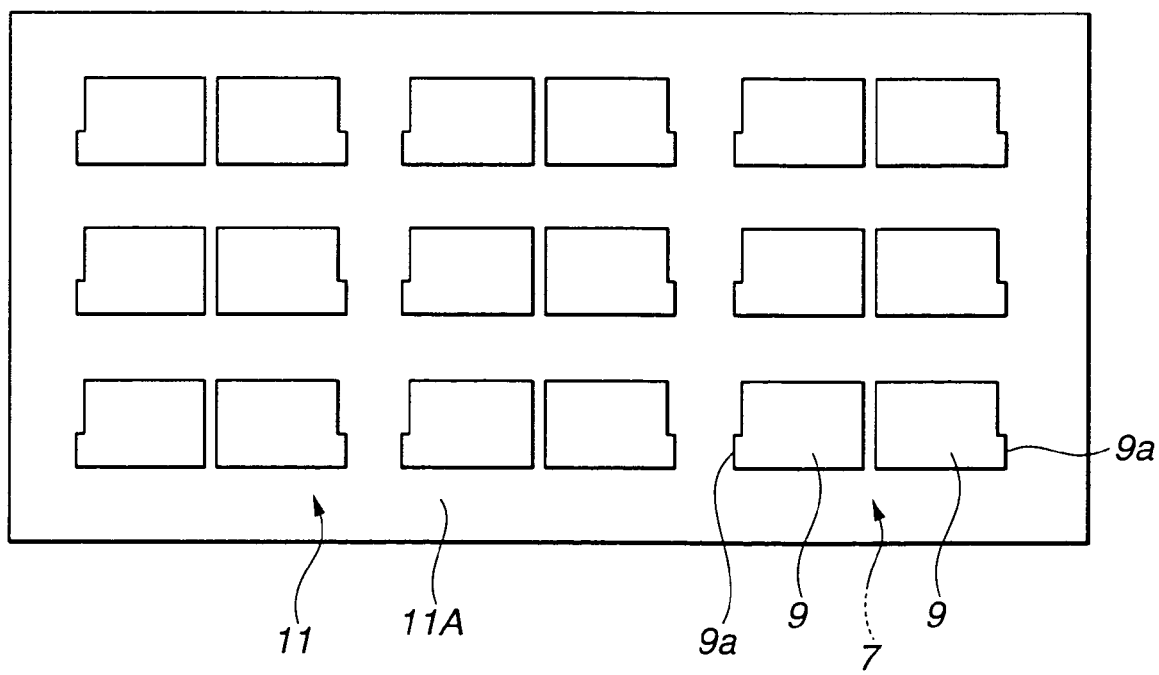
FIG. 3B is a front view of a second piezoelectric sheet contained in the ultrasonic vibrator according to the first embodiment.
Figure 4A:
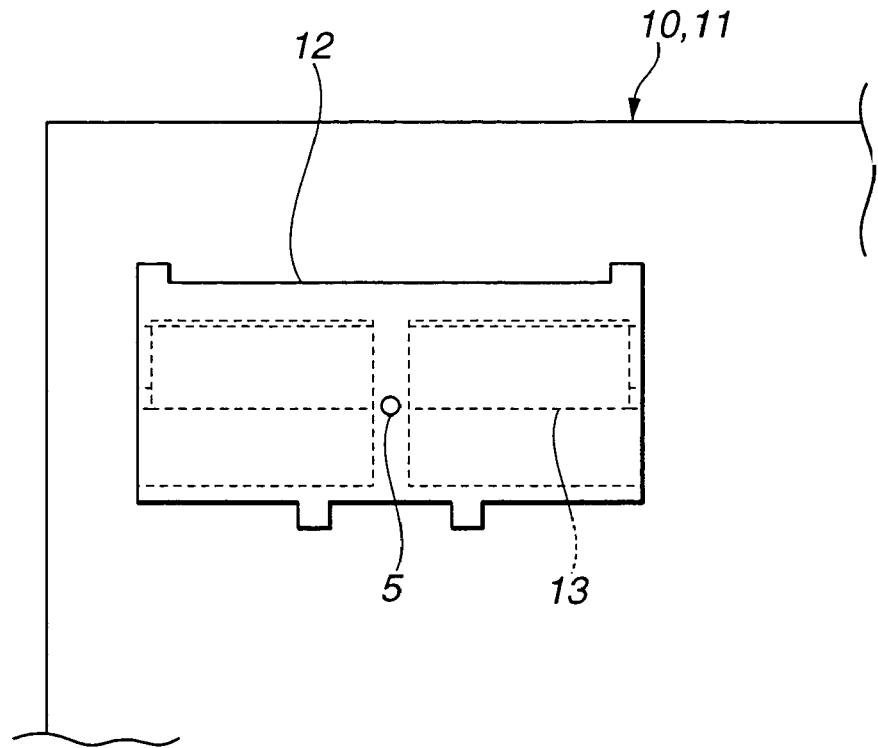
FIGS. 4A to 4B illustrates a production process for cutting the first and second piezoelectric sheets for use in the ultrasonic vibrator according to the first embodiment, to obtain the piezoelectric laminate unit.
Figure 4B:
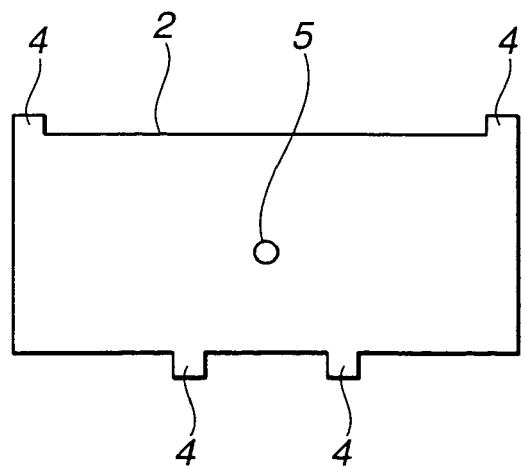

Hereinafter, a method of producing the ultrasonic vibrator of the first embodiment is described with reference to FIGS. 3A, 3B, 4A, and 4B. FIG. 3A shows a first piezoelectric sheet portion on which a plurality of the first internal electrodes are printed in a pattern. FIG. 3B shows a second piezoelectric sheet portion on which a plurality of the second internal electrodes are printed in a pattern. FIG. 4A shows the first and second piezoelectric sheet portions which overlap each other when the sheet portions are cut. FIG. 4B shows the shape of the piezoelectric laminate unit obtained after the cutting.

According to the method of producing the ultrasonic vibrator of the first embodiment, temporarily sintered powder of PZT and a binder are mixed. The formed casting slip is cast onto a film having a predetermined thickness by a doctor blade method. Thus, green sheets 10A and 11A (corresponding to the piezoelectric layers 6A and 7A) are formed. The green sheets 10A and 11A are dried, and then, are released from the film. Thus, plural green sheets 10A and 11A formed as described above and having a thickness of, e.g., about 50 µm are prepared.

Next, an electrode material is printed on the green sheet 10A using a mask having plural patterns of the first internal electrode 8 (see FIG. 2). Thus, the first piezoelectric sheet portion 10 shown in FIG. 3A is formed. In this case, the first internal electrode 8 is formed with a silver-palladium alloy (Ag—Pd).

An electrode material is printed on the green sheet 11A using a mask having plural patterns of the second internal electrode 9 (see FIG. 2). Thus, the second piezoelectric sheet portion 11 shown in FIG. 3B is formed. In this case, similarly, the second internal electrode 9 is formed with a silver-palladium alloy (Ag—Pd).

The first piezoelectric sheet portion 10 and the second piezoelectric sheet portion 11 are positioned accurately by use of, e.g., an internal electrode perspective boundary line 13, so that the first and second internal electrodes 8 and 9 correctly overlap each other. Then, a plurality of the sheet portions and a plurality of the sheet portions are alternately laminated. Thereafter, the third green sheet (hot shown) having no internal electrode printed thereon is laminated onto the uppermost surface of the laminate.

Thereafter, the laminate of the first and second piezoelectric sheet portions 10, 11 including the third green sheet are pressed, so that the respective green sheets of the laminate come into close contact with each other.

Subsequently, as shown in FIG. 4A, the holes 5 are formed in the centers of the piezoelectric laminate units 2 of the laminate, respectively.

The laminate is sandwiched between a punch (male mold) having a contour as represented by a cutting line 12 in FIG. 4A and a die (female mold) of a press mold. The punch and the die are combined and paired. The punch is moved vertically to be fitted into the die. The laminate sandwiched as described above is cut considering the positions of the internal electrodes. The cutting method is not restricted to the above-described method. The laminate may be cut with a knife having a contour shown by the cutting line 12. Thus, any other cutting method may be employed, provided that the cutting can be carried out along the cutting line 12.

Thus, a piezoelectric element having a contour shown in FIG. 4B can be formed. That is, in the piezoelectric element, the friction-projections 4 are formed so as to be integrated with the piezoelectric laminate unit 2.

Thereafter, the piezoelectric element shown in FIG. 4B is fired. Thus, the piezoelectric element corresponding to the piezoelectric laminate unit 2 is formed.

Silver is baked on the internal electrode exposed portions 8a and 9a (see FIG. 2). Thereby, the external electrodes 3 in belt patterns as shown in FIG. 1B are formed. Similarly, the external electrodes 3 having belt and crank patterns shown in FIG. 1A are formed by baking silver on the surface of the piezoelectric laminate unit 2. DC high voltages are applied to the external electrode 3 in the phase A (between A+ and A−) and the external electrode 3 in the phase B (between B+ and B−), so that the polarization is performed. Thus, a piezoelectric characteristic is rendered to the piezoelectric laminate unit 2.

Thus, the piezoelectric laminate unit 2 is formed.

Figure 5A:
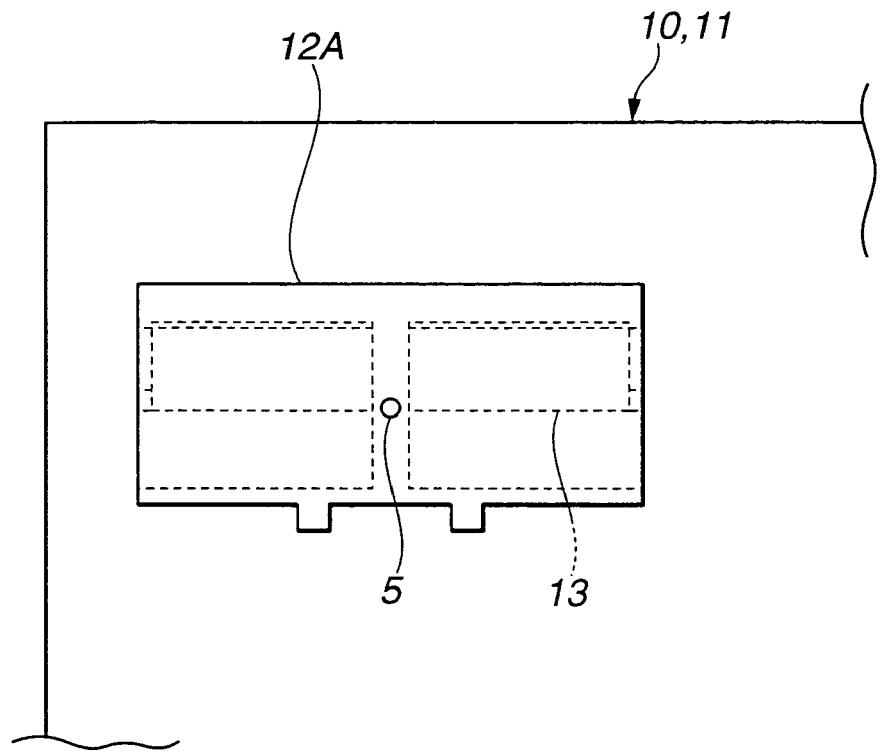
FIGS. 5A to 5B illustrate another example of the production process for cutting the first and second piezoelectric sheets for use in the ultrasonic vibrator according to the first embodiment, to obtain the piezoelectric laminate unit.
Figure 5B:
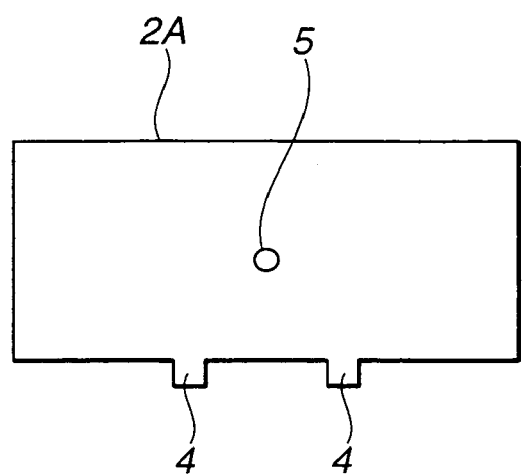

According to a modification of the method of producing the ultrasonic vibrator 1 of this embodiment, the cutting may be carried out by means of, e.g., a press mold provided with a punch (male mold) having a contour shown by the cutting line 12A in FIG. 5A, and a die (female mold). Thus, a piezoelectric laminate unit 2A having two friction-projections 4 on the bottom surface as shown in FIG. 5B is formed.

Figure 6A:
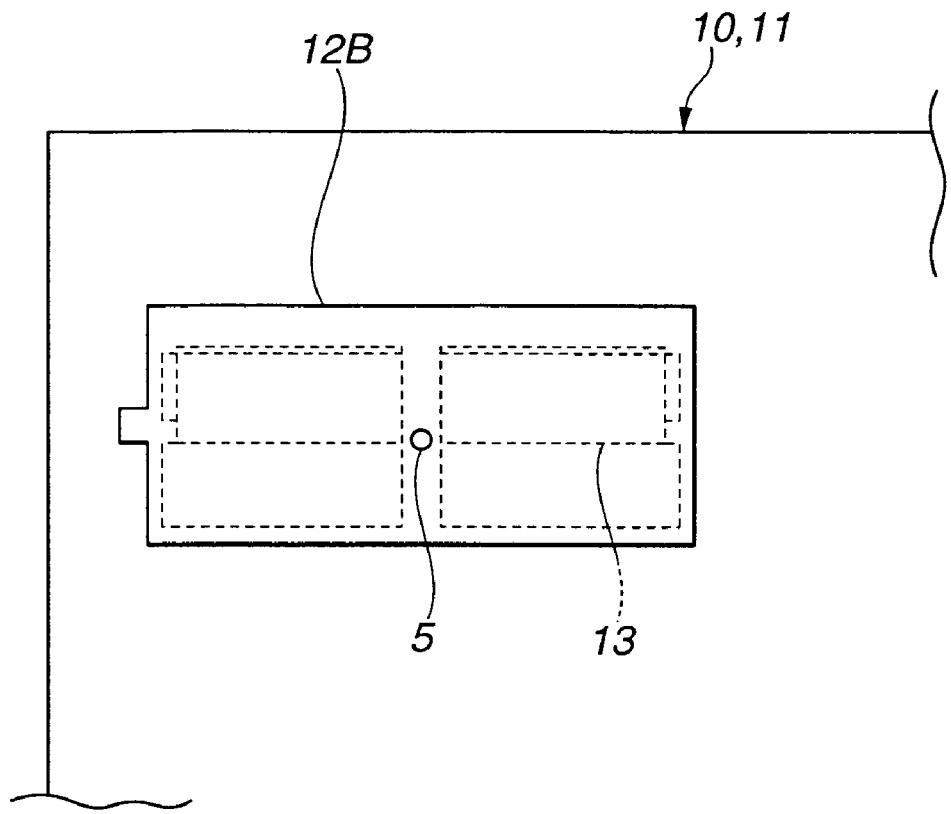
FIGS. 6A to 6B illustrate still another example of the production process for cutting the first and second piezoelectric sheets for use in the ultrasonic vibrator according to the first embodiment, to obtain the piezoelectric laminate unit.
Figure 6B:
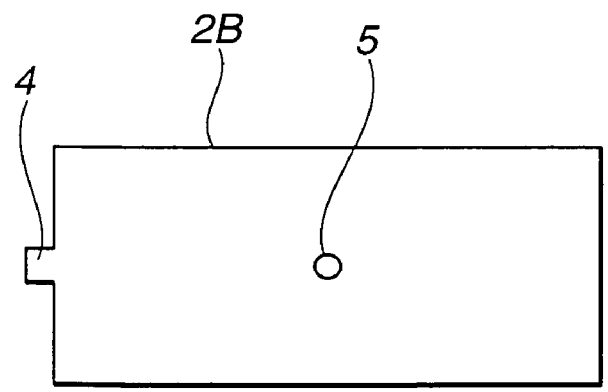

Moreover, according to another modification example, the cutting may be carried out by means of, e.g., a press mold provided with a punch (male mold) having a contour shown by the cutting line 12B in FIG. 6A, and a die (female mold). Thus, a piezoelectric laminate unit 2B having one friction-projection 4 on the side face as shown in FIG. 6B is formed.

Hereinafter, the operation of the ultrasonic vibrator 1 according to the first embodiment is described with reference to FIGS. 7A, 7B, 8A, and 8B.

Alternating voltages having a frequency of about 300 kHz in phase with each other are applied to the phases A and B in the ultrasonic vibrator 1. Then, primary longitudinal vibration is excited in the ultrasonic vibrator 1. On the other hand, alternating voltages having a frequency of about 300 kHz and in 180° out of phase with each other. Then, secondary bending vibration is excited in the ultrasonic vibrator 1.

Figure 7A:
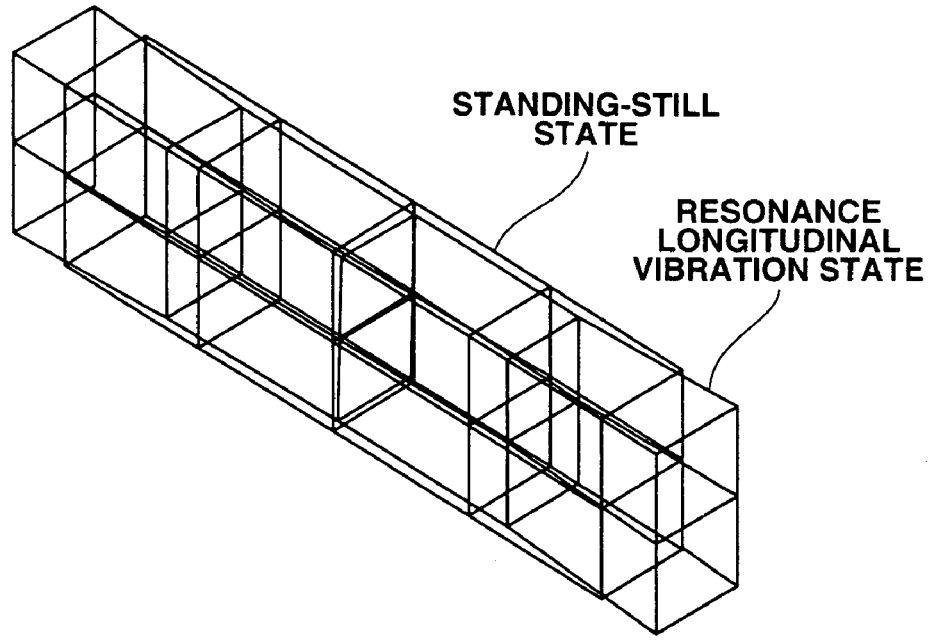
FIGS. 7A to 7B are enlarged perspective views of an essential part schematically illustrating an example of the operation of the ultrasonic vibrator according to the first embodiment.
Figure 7B:
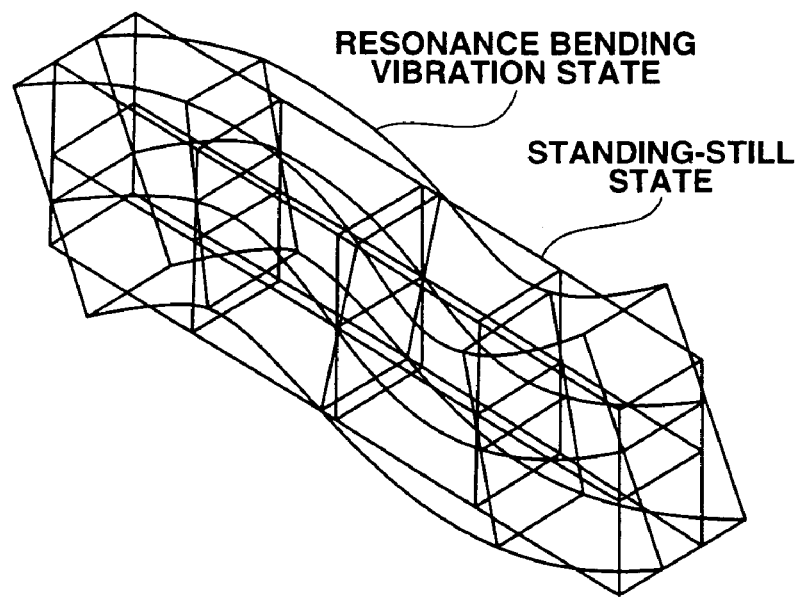

These vibrations are analyzed with a computer according to the finite element method. Thus, a resonance longitudinal vibration posture shown in FIG. 7A and a resonance bending vibration posture shown in FIG. 7B are estimated. As a result of the measurement on the ultrasonic vibration, these postures have been demonstrated. It is to be noted that in FIGS. 7A and 7B, the friction-projection 4 are omitted.

According to the first embodiment, it is designed that the resonance frequency, i.e., the resonance frequency of the secondary bending vibration is smaller by several percents (preferably, by about 3%) than that of the primary longitudinal vibration. With this design, the output characteristic of an ultrasonic linear motor which will be described below is considerably improved.

Subsequently, alternating voltages having a frequency of about 300 kHz and a phase difference of $\pi/2$ are applied to the phases A and B of the ultrasonic vibrator 1. Thus, the elliptical vibration can be observed at the positions of the friction-projections 4.

In this case, the direction of the rotation caused by the ultrasonic vibration observed at the friction-projections 4 existing on the bottom surface of the ultrasonic vibrator 1 and that observed at the friction-projections 4 bonded to the upper surface of the ultrasonic vibrator 1 are opposite to each other.

Figure 8A:
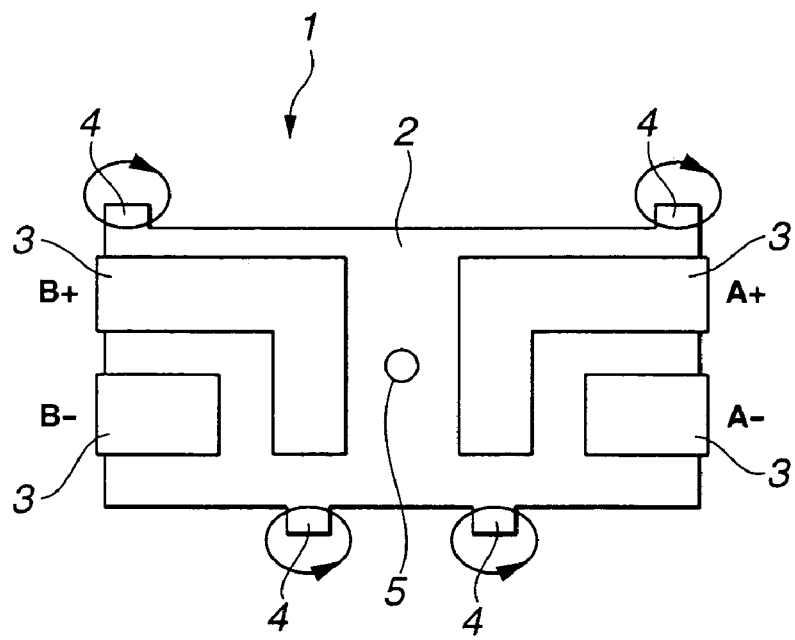
FIGS. 8A and 8B illustrates the excitation which is caused in the vicinity of a friction-projection contained in the ultrasonic vibrator according to the first embodiment.
Figure 8B:
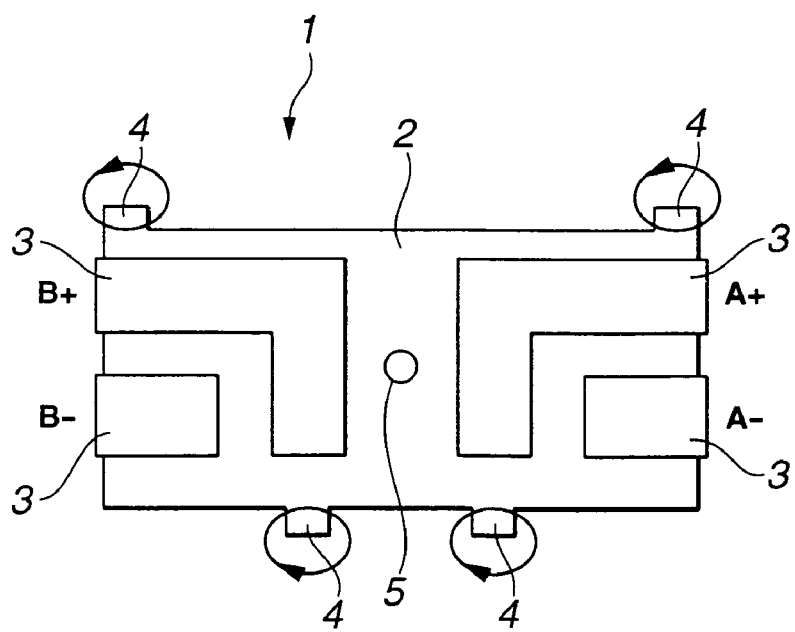

In particular, as shown in FIG. 8A, when the phase of the alternating voltage applied to the phase A lags by $\pi/2$ than that of the alternating voltage applied to the phase B, the friction-projection 4 on the bottom surface is rotated in the counterclockwise direction, while the friction-projections 4 on the upper surface are rotated in the clockwise direction. When the friction-projections 4 are arranged on the same surface so as to be rotated in the same direction as described above, the driving force can be taken out most effectively.

Moreover, in the case in which the alternating voltage applied to the phase A leads the voltage applied to the phase B by a phase angle of $\pi/2$, the friction-projections 4 on the bottom surface are rotated in the clockwise direction, while the friction-projections 4 on the upper surface are rotated in the counterclockwise direction.

Hereinafter, the structure of an ultrasonic motor (hereinafter, referred to as an ultrasonic linear motor) 20 is described with reference to FIGS. 9A and 9B.

Figure 9A:
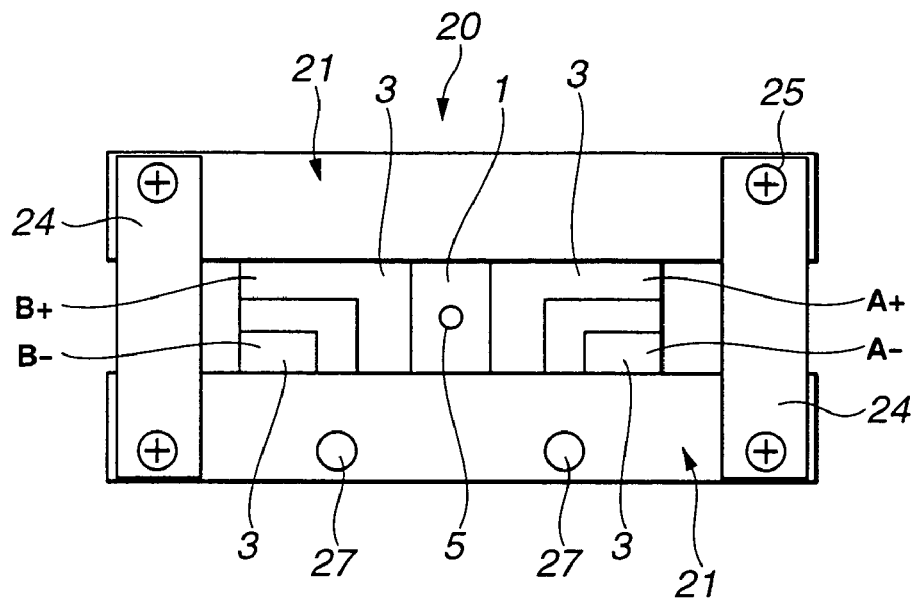
FIG. 9A is a front view of an ultrasonic linear motor using the ultrasonic vibrator according to the first embodiment.

FIG. 9A is a front view of the ultrasonic linear motor. FIG. 9B is a side view of the ultrasonic linear motor.

Figure 9B:
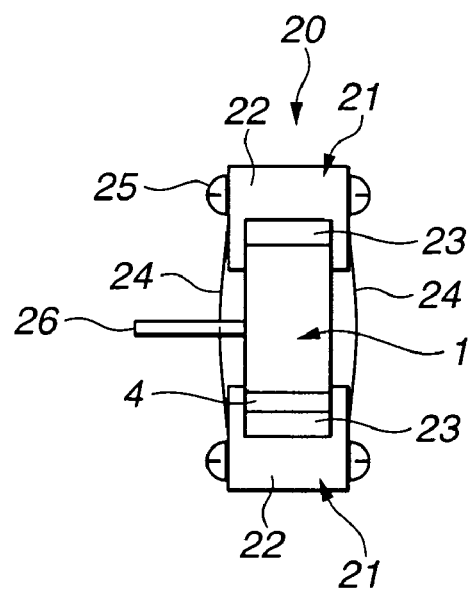
FIG. 9B is a side view showing one side of ultrasonic linear motor according to the first embodiment.

As shown in FIGS. 9A and 9B, an ultrasonic linear motor 20 using the ultrasonic vibrator of this embodiment comprises the ultrasonic vibrator 1, a pair of guides 21 for holding the ultrasonic vibrator 1, and plate springs 24 which are arranged on the side faces of a pair of the guides 21, and bias the guides 21 so as to press the ultrasonic vibrator 1 and the guides 21 placed between the guides 21 at a predetermined pressure.

The guides 21 transmit a force from pressing members (plate springs 24 in this embodiment) to the ultrasonic vibrator 1. Moreover, the guides 21 regulate the movement relative to the guides 21 of the ultrasonic vibrator 1 in the direction perpendicular to the contact planes between the guides 21 and the ultrasonic vibrator 1. Here, the regulation in the horizontal direction is carried out by a member integrated with the guides 21. However, a member separated from the guides 21 may be used for the regulation.

Moreover, according to this embodiment, an example of the regulation which causes the ultrasonic vibrator 1 to move linearly is described. In the case in which guides each having a moderately curved shape in one or both of the vertical and horizontal directions, the ultrasonic vibrator 1 can be driven along the curved line.

That is, in the ultrasonic linear motor 20 using the ultrasonic vibrator of this embodiment, the ultrasonic vibrator 1 is sandwiched between the two guides 21 via the friction-projections 4 formed on the surfaces opposite to each other of the ultrasonic vibrator 1 which are in contact with the guides 21. Thus, the ultrasonic linear motor 20 is formed as a self-propelled ultrasonic linear motor 20.

As shown in FIG. 9B, the guides 21 holding the ultrasonic vibrator 1 contains guide cases 22 having a U-character shape and sliding plates 23 bonded to the upper and lower inner surfaces of the guide cases 22.

The guide cases 22 are formed with aluminum. The sliding plates 23 are formed with a zirconia ceramic having a surface roughness (Ra) of not more than 0.1 μm.

Moreover, according to this embodiment, the plate springs 24 are disposed between the ultrasonic vibrator 1 and the sliding plates 23 to exert a predetermined pressing force. The plate springs 24 are biased so that the two guides 21 are attracted toward each other. That is, as shown in FIG. 9A, the plate springs 24 exhibit their spring properties in the vertical direction and have a function as members for fixing the two upper and lower guides 21 in the right and left direction. As pressing members, pieces which are effective in reducing the interval between the first and second guides such as coil springs, magnets, and the like may be used. Desirably, the pressing members are disposed as near to both of the ends as possible, so the pressing does not become impossible, depending on the positions in the ultrasonic vibrator 1, or the pressing does not become extremely weak.

As shown in FIG. 9A, two plate springs 24 are arranged on both of the end portions on the front surface of the ultrasonic linear motor 20, and two plate springs 24 are arranged on both of the end portions on the back surface thereof. These plate springs 24 are screwed with screws 25 and fixed to the guides 21, respectively.

Practically, the plate springs 24, while they are in the ordinary state, are slightly bent. Both of the ends of the respective plate springs 24 are fixed to the two guides 21 while their shapes are adjusted in such a manner that the guides 21 are substantially stretched and generates a tensile strength.

The lower guide 21 is provided with plural holes 27 for fixing. The lower guide 21 is fixed onto a base plate (not shown) by use of the holes 27 and screws or the like. On the other hand, the upper guide 21 is not fixed onto a base plate (not shown), and is simply held by means of the plate springs 24.

Accordingly, when the ultrasonic vibrator 1 is positioned near to one of the ends, the upper and lower guides 21 are not in parallel to each other (the interval between them on the side where the ultrasonic vibrator 1 does not exist is slightly smaller than that on the other side). Simultaneously, in some cases, some of the friction-projections 4 are not in contact with the guides 21. These behaviors can be eliminated by addition of a mechanism for maintaining the parallel arrangement. However, it is not essential for the driving that a part of the friction-projections 4 are released from the guides 21. For example, when the ultrasonic vibrator 1 is positioned substantially in the center of the stroke, all of the four friction-projections 4 shown in FIG. 1A are in contact with the guides 21. When the ultrasonic vibrator 1 is positioned in the left end of the stroke, the lower, left friction-projections 4 may be lifted to some degree. Also, when the ultrasonic vibrator 1 is positioned in the right end of the stroke, the lower, right friction-projections 4 may be lifted to some degree. In these cases, the friction-projections 4 not lifted (the lower, right friction-projections 4 when the ultrasonic vibrator 1 is positioned in the left end of the stroke) are in contact with the guide 21, and carries out the elliptical vibration, which is a source of the driving force.

Accordingly, the friction-projections 4 are members or parts including contact-portions. The contact-portions are defined as parts which come into contact with the guides 21 in at least a part of the stroke. Moreover, a pin 26 for taking out an output is bonded in the center of the ultrasonic vibrator 1, i.e., the common node (in the vicinity of the standing-still point in the respective vibration modes) of the primary longitudinal vibration and the secondary bending vibration. Even if the ultrasonic vibrator 1 utilizes another vibration mode or the synthesis of vibration modes, the driving force can be transmitted through the pin arranged in the common node of the mode or in the portion of the ultrasonic vibrator 1 where the vibration becomes minimal while the vibration is not disturbed. When the ultrasonic linear motor is mounted in an electronic apparatus, devices or the like, the pin 26 functions as driving-transmitting means for transmitting a driving force to the outside (a driving mechanism in the electronic apparatus, a driven piece in the device).

Needless to say, if the ultrasonic vibrator 1 is engaged with a driven piece by means of an engaging member provided on the driven piece side, the pin 26 is not necessary.

Hereinafter, the operation of the ultrasonic linear motor 20 is described.

Alternating voltages having a frequency of 300 kHz and a phase difference of $\pi/2$ are applied to the phase A (A+, A−) and the phase B (B+, B−). Then, the primary longitudinal vibration and the secondary bending vibration are excited at the friction-projections 4. Thus, the ultrasonic elliptical vibration in the clockwise or counterclockwise direction is generated.

As described above, the ultrasonic elliptical vibration is generated at the friction-projection 4 of the ultrasonic vibrator 1. Thereby, the ultrasonic vibrator 1 itself can be driven in the right or left direction. That is, a self-propelled ultrasonic linear motor can be formed.

Figure 10:
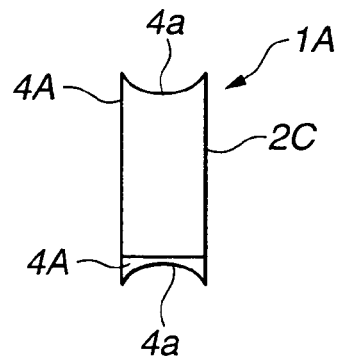
FIG. 10 is an enlarged side view showing an essential part of the friction projection for use in the ultrasonic vibrator according to the first embodiment and the vicinity to the projection.

According to the method of producing the ultrasonic vibrator of this embodiment, as a modification, a process of grinding the friction-projections 4 into a columnar shape, for example, may be carried out before the piezoelectric element (see FIG. 4B) formed by the cutting is fired. FIG. 10 shows the configuration of the piezoelectric element which is formed by the grinding process.

As shown in FIG. 10, the friction-projections 4A of the piezoelectric element 2C (corresponding to the piezoelectric laminate unit) obtained after the cutting are ground into a concave shape in the length direction (the driving direction of the piezoelectric laminate unit) by means of a drill or the like. Thereby, the friction-projections 4A have a concave portion 4a having a conical surface. Thereafter, similarly to the above-described production method, the piezoelectric element having a contour shown in FIG. 10 is fired, the external electrodes 3 are formed, and the polarization is carried out. Thus, an ultrasonic vibrator 1A is formed. According to this embodiment, the process of grinding the friction-projections 4 into a columnar shape is carried out, and thus, the friction-projections 4A having conical surfaces 4a are formed. This is not restrictive. For example, a process of grinding the friction-projections 4 into a V-shape may be carried out, and thereby, the friction-projections 4 of which the concave portions each have a V-shape are formed.

Figure 11A:
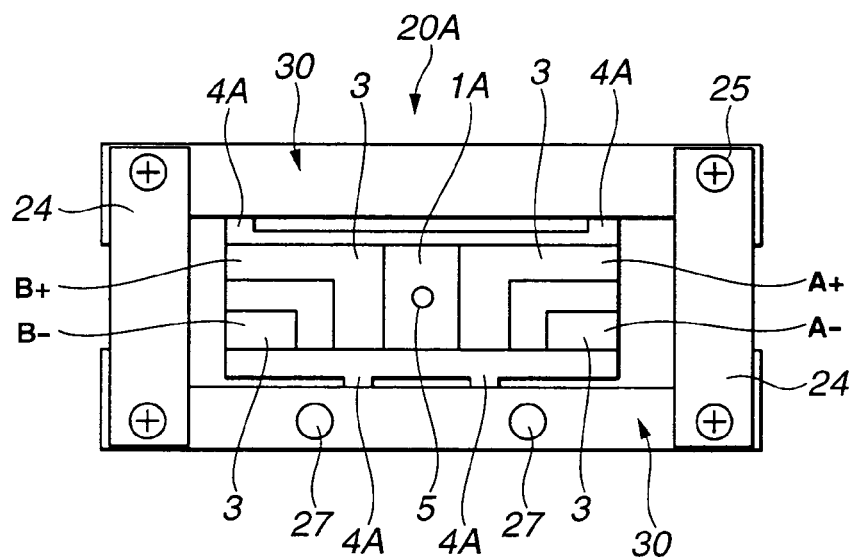
FIG. 11A is a front view of an ultrasonic linear motor using the ultrasonic vibrator shown in FIG. 10.
Figure 11B:
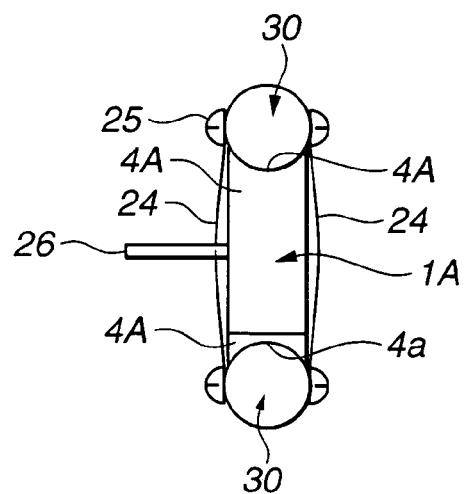
FIG. 11B is a side view showing one side of the ultrasonic linear motor using the ultrasonic vibrator shown in FIG. 10.

FIGS. 11A and 11B show a self-propelled ultrasonic linear motor using the ultrasonic vibrator 1A. FIGS. 11A and 11B illustrate the structure of the ultrasonic linear motor which is formed using the ultrasonic vibrator. FIG. 11A is a front view of the ultrasonic liner motor. FIG. 11B is a side view of the ultrasonic linear motor.

As seen in FIGS. 11A and 11B, the ultrasonic linear motor 20A of this embodiment has a structure similar to that of the ultrasonic linear motor 20. A pair of guides 30 which are in contact with the friction-projections 4A have a shape different from that of the guides 21, corresponding to the shapes of the friction-projections 4A having the concave portions 4a.

As shown in FIG. 11B, the guides 30 are formed as a pair of columnar sliding shafts which are fitted into the concave portions 4a of the friction-projections 4A formed on the opposite surfaces of the ultrasonic vibrator 1A.

The sliding shafts 30 transmit a force from the plate springs 24 to the ultrasonic vibrator 1A. Moreover, the sliding shafts 30 regulate the movement relative to the sliding shafts 30 of the ultrasonic vibrator 1A in the direction perpendicular to the contact planes between the sliding shafts 30 and the ultrasonic vibrator 1A.

As shown in FIG. 11A, in the ultrasonic linear motor 20A of the embodiment, the ultrasonic vibrator 1A is sandwiched between the two sliding shafts 30 as guides. The sliding shafts 30 are in contact with the concave portions 4a of the friction-projections 4 formed on the surfaces opposite to each other of the ultrasonic vibrator 1A. Thus, the self-propelled ultrasonic linear motor 20A is formed.

In the ultrasonic linear motor 20A of this embodiment, the sliding shafts 30 are formed with a zirconia ceramic having a surface roughness (Ra) of not more than 0.05 μm.

Moreover, according to the ultrasonic linear motor 20A of this embodiment, the plate springs 24 are disposed so as to exerts a predetermined force between the ultrasonic vibrator 1A and the sliding shafts 30. The plate springs 24 are biased so that the two sliding shafts 30 are attracted toward each other. That is, as shown in FIG. 11A, the plate springs 24 have spring properties in the vertical direction and have a function as members for fixing the two, upper and lower, sliding shafts 30 in the right and left direction.

As pressing members, pieces which are effective in reducing the interval between the first and second sliding shafts 30 such as coil springs, magnets, and the like may be used, similarly to the above-described example of the structure (see FIG. 9A or the like). Desirably, the pressing members are disposed as near to both of the ends as possible, so that the pressing does not become impossible, or the pressing does not become extremely weak depending on the positions in the ultrasonic vibrator 1A.

As shown in FIG. 11A, the two plate springs 24 are arranged on both of the end portions on the front surface of the ultrasonic linear motor 20A, and two plate springs 24 are arranged on both of the end portions on the back surface thereof. These plate springs 24 are screwed with screws 25 and fixed to the sliding shafts 30, respectively.

Practically, the plate springs 24, while they are in the ordinary state, are slightly bent. Both of the ends of the respective plate springs 24 are fixed to the two sliding shafts 30 while their shapes are adjusted in such a manner that the plate springs 24 are substantially stretched and generate a tensile force.

The lower sliding shaft 30 is provided with plural holes 27 for fixing. The lower sliding shaft 30 is fixed onto a base plate (not shown) by use of the holes 27 and screws or the like. On the other hand, the upper sliding shaft 30 is not fixed onto a base plate (not shown), and is simply held by means of the plate springs 24.

Moreover, a pin 26 for taking out an output is bonded in the center of the ultrasonic vibrator 1A, i.e., the common node (in the vicinity of the standing-still point in the respective vibration modes) of the primary longitudinal vibration and the secondary bending vibration.

The other constitutions of the ultrasonic linear motor 20A are similar to those of the ultrasonic linear motor 20.

Hereinafter, the operation of the ultrasonic linear motor 20A is described.

Alternating voltages having a frequency of 300 kHz and a phase difference of $\pi/2$ are applied to the phase A (A+, A) and the phase B (B+, B−). Then, the primary longitudinal vibration and the secondary bending vibration are excited at the friction-projections 4A. Thus, the ultrasonic elliptical vibration is excited in the clockwise or counterclockwise direction.

As described above, the ultrasonic elliptical vibration is generated at the friction-projection 4A of the ultrasonic vibrator 1A. Thereby, the ultrasonic vibrator 1A itself can be driven in the right or left direction. That is, a self-propelled ultrasonic linear motor can be formed.

According to this embodiment, in the ultrasonic vibrator 1 and 1A, the friction-projections 4 are formed in advance during the production process, in the sites where the ultrasonic elliptical vibration is to be caused, and thereafter, the burning is carried out. Accordingly, it is not necessary to bond the friction-projections 4 with an adhesive in the sites where the ultrasonic elliptical vibration is caused, after the burning of the ultrasonic vibrator. Thus, the production process can be simplified, and the cost can be reduced. In addition, the friction-projections 4 can be accurately formed.

According to this embodiment, regarding the configuration of the internal electrodes, the negative pole side (A−, B−) may be formed as a whole surface electrode, not divided into the two portions. In this case, the negative pole side (A−, B−) is a common negative pole.

In this embodiment, the ultrasonic vibrator is a self-propelled ultrasonic linear motor. The ultrasonic vibrator can be formed as an ultrasonic linear motor of such a type that the ultrasonic vibrator is fixed, and the driven piece is caused to move linearly.

Moreover, by pressing a rotating piece as the driven piece in the sites where the ultrasonic elliptical vibration is caused in the ultrasonic vibrator, the ultrasonic vibrator can be formed as a type of an ultrasonic rotating motor that the driven piece is caused to move rotatively.

Moreover, according to this embodiment, as the piezoelectric element, the laminate type piezoelectric element is employed. Even if a plate-shaped piezoelectric element, which is not a laminate type, is used, an ultrasonic vibrator having the same structure can be formed.

Hereinafter, an ultrasonic vibrator according to a second embodiment of the present invention will be described.

Figure 12:
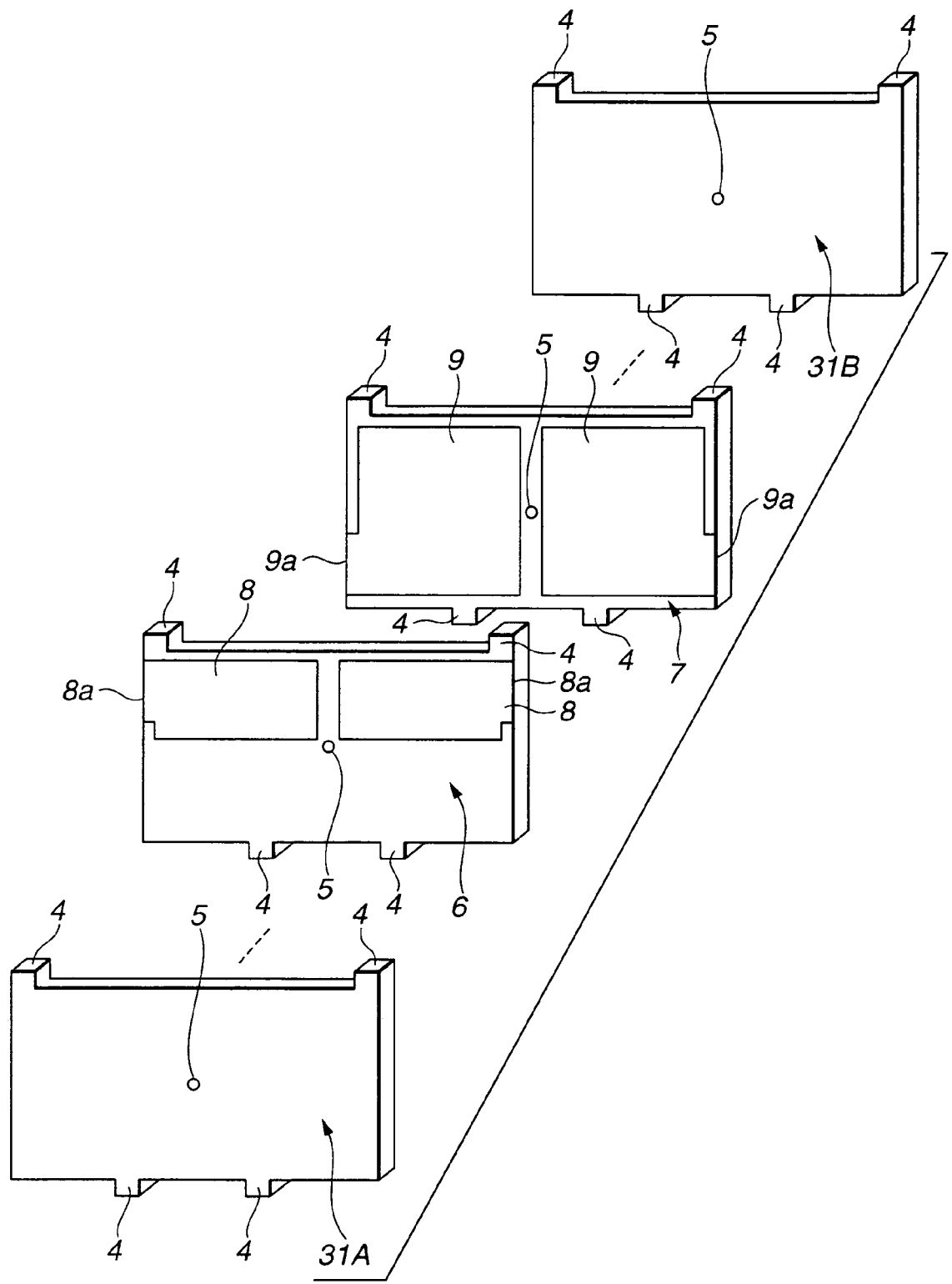
FIG. 12 is an enlarged perspective view showing an essential part, i.e., the piezoelectric laminate unit of an ultrasonic vibrator according to a second embodiment of the present invention.

FIG. 12 is an enlarged perspective view showing an essential part, i.e., the piezoelectric laminate unit of an ultrasonic vibrator according to a second embodiment of the present invention.

The appearance of the ultrasonic vibrator is the same as that of the ultrasonic vibrator 1 of the first embodiment shown in FIG. 1A, excepting that non-piezoelectric sheets 31A and 31B are provided as a first layer (uppermost layer) and as a last layer (lowermost layer) for the laminate composed of the first piezoelectric sheets 6 and the second piezoelectric sheet 7 which are alternately laminated as shown in FIG. 12. The non-piezoelectric sheets 31A and 31B are reinforcing sheets of layers made of alumina ceramics which are non-piezoelectric ceramic materials.

The shapes of the non-piezoelectric sheets 31A and 31B are similar to those of the first and second piezoelectric sheets 6 and 7. That is, in the non-piezoelectric sheets 31A and 31B, the friction-projections 4 are formed so as to position at two sites on the bottom face and two sites on the upper face thereof and also so as to be integrated with the sheets.

The other constitutions of the ultrasonic vibrator according to the second embodiment are similar to those of the ultrasonic vibrator according to the first embodiment.

Referring to a method of producing the ultrasonic vibrator of the second embodiment, green sheets made of alumina ceramic fine particles and having a thickness of about 100 µm are prepared.

A plurality of the first piezoelectric sheet portions 10 each having patterns for the first internal electrode 8 printed thereon (see FIG. 3A) and a plurality of the second piezoelectric sheet portions 11 each having patterns for the second internal electrodes 9 printed thereon (see FIG. 3B) are alternately laminated on the green sheet. Finally, another green sheet made of alumina ceramic fine particles is laminated.

The succeeding processes are the same as those of the first embodiment. The description is not repeated.

The finally obtained friction-projections 4 of the ultrasonic vibrator are formed with a ceramic composite material comprising the piezoelectric ceramic element material and the alumina ceramic material. This is different from the first embodiment.

The applicant formed the ultrasonic linear motor 20 (see FIG. 9A), which is similar to the ultrasonic linear motor according to the first embodiment, using the ultrasonic vibrator of the second embodiment. The operation characteristics of the motor were investigated. The results are satisfactory and comparable to those of the first embodiment. For the ultrasonic linear motor of the second embodiment, the amount of abrasion power formed by the operation is small compared to that of the ultrasonic linear motor of the first embodiment. Thus, the sliding characteristic is improved.

In the ultrasonic vibrator of the second embodiment, the friction-projection 4 are formed of the composite material comprising the piezoelectric ceramic element material and the alumina ceramic material, which is different from the friction-projections 4 of the first embodiment. Therefore, when the ultrasonic linear motor is formed using the ultrasonic vibrator and is operated, the amount of abrasion powder is reduced. Thus, the abrasion characteristic of the friction-projections 4 is further improved, and thus, the durability and the sliding property can be enhanced. Other advantages are similar to those of the first embodiment.

As described above, in the second embodiment, the non-piezoelectric layers as reinforcing sheets made of the non-piezoelectric ceramic material are laminated as the uppermost layer and as the lowermost layer in the ultrasonic vibrator. This is not restrictive. For example, at least one non-piezoelectric layer formed with the non-piezoelectric ceramic material may be inserted in an optional position and laminated.

The present invention is not restricted to the first and second embodiments and the modification examples. Various modifications can be carried out without departing from the sprit and scope of the present invention.

Moreover, the present invention includes such embodiments in which the above-described embodiments are partially combined and so forth.

Referring to the ultrasonic vibrator of the present invention, the production process can be simplified, and the cost can be reduced. Moreover, the friction-projections can be accurately formed to the piezoelectric laminate portion. Thus, the ultrasonic linear motor formed using the ultrasonic vibrator is effective as a driving source for various electronic apparatuses in which the cost reduction, the improvement of the durability and the stability of the driving efficiency are required.

In this invention, it is apparent that working modes different in a wide range can be formed on this basis of this invention without departing from the sprit and the scope of the invention. This invention is not restricted by any specific embodiment except being limited by the appended claims.

What is claimed is:

1. An ultrasonic vibrator comprises:
a piezoelectric element composed of a plurality of piezoelectric pieces laminated to each other; and
two or more friction-projections formed by burning so as to be integrated with the piezoelectric element, in which ultrasonic elliptical vibration is caused by the simultaneous generation of a first vibration mode and a second vibration mode in the piezoelectric element, and the friction projections are composed of a plurality of piezoelectric ceramic sheets each having a part of the friction-projections laminated to each other in a direction which is parallel to a contact plane opposed to and contacting the friction projections and is perpendicular to a moving direction of the friction projections with internal electrodes being interposed between the ceramic sheets, and a part of the friction-projections provided for the piezoelectric ceramic sheets are formed with the same material for the piezoelectric ceramic sheets, and the first vibration mode is longitudinal vibration, and the second vibration mode is bending vibration.

* * * * *